US012677655B2

(12) United States Patent
Choi et al.

(10) Patent No.: US 12,677,655 B2
(45) Date of Patent: Jul. 7, 2026

(54) SUBSTRATE BONDING METHOD

(71) Applicant: SAMSUNG ELECTRONICS CO., LTD., Suwon-si (KR)

(72) Inventors: Wonyoung Choi, Suwon-si (KR); Minwoo Rhee, Suwon-si (KR); Sungyoung Yoon, Suwon-si (KR); Jaehyun Phee, Suwon-si (KR); Bumki Moon, Suwon-si (KR); Kyeongbin Lim, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 372 days.

(21) Appl. No.: 18/384,250

(22) Filed: Oct. 26, 2023

(65) Prior Publication Data

US 2024/0145416 A1 May 2, 2024

(30) Foreign Application Priority Data

Oct. 28, 2022 (KR) ........................ 10-2022-0141757

(51) Int. Cl.
*H10W 20/41* (2026.01)
*H10W 72/00* (2026.01)
(Continued)

(52) U.S. Cl.
CPC .... *H10W 20/435* (2026.01); *H10W 72/01938* (2026.01); *H10W 72/923* (2026.01);
(Continued)

(58) Field of Classification Search
CPC ......... H10W 20/435; H10W 72/01938; H10W 72/923; H10W 72/925; H10W 72/952;
(Continued)

(56) References Cited

U.S. PATENT DOCUMENTS 8,278,186 B2 10/2012 Cha et al.
9,040,385 B2 5/2015 Chen et al.
(Continued)

FOREIGN PATENT DOCUMENTS

KR 10-0980045 B1 9/2010
KR 10-2020-0044371 A 4/2020
KR 10-2136129 B1 7/2020

OTHER PUBLICATIONS

Yong-Won Cha et al., "High Speed Direct Bonding of Silicon Wafer Using Atmospheric Pressure Plasma," J. Microelectron. Packag. Soc., 22(3), pp. 31-38 (2015) (Total 20 pages) http://dx.doi.org/10.6117/kmeps.2015.22.3.031.
(Continued)

*Primary Examiner* — Dao H Nguyen
(74) *Attorney, Agent, or Firm* — Sughrue Mion, PLLC

(57) ABSTRACT

A substrate bonding method includes: forming first plasma on a bonding surface of a first substrate at atmospheric pressure by using a mixed gas including an inert gas and water vapor, to thereby perform surface activation treatment on the bonding surface of the first substrate; forming second plasma on a bonding surface of a second substrate at atmospheric pressure by using the mixed gas, to thereby perform surface activation treatment on the bonding surface of the second substrate; bonding the bonding surface of the first substrate and the bonding surface of the second substrate to each other; and moving each of the first substrate and the second substrate at a constant speed in a region above a linear reactor in which the first plasma and the second plasma are formed.

10 Claims, 13 Drawing Sheets

(51) Int. Cl.
  *H10W 72/90* (2026.01)
  *H10W 90/00* (2026.01)
(52) U.S. Cl.
  CPC ........ *H10W 72/925* (2026.01); *H10W 72/952* (2026.01); *H10W 90/792* (2026.01)
(58) Field of Classification Search
  CPC .............. H10W 72/019; H10W 72/90; H10W 72/0198; H10W 90/792; H10W 99/00; H10W 80/301
  See application file for complete search history.

(56) References Cited

U.S. PATENT DOCUMENTS

| | | | |
|---|---|---|---|
| 9,331,032 B2 | 5/2016 | Liu et al. | |
| 10,790,260 B2 * | 9/2020 | Liu ....................... | H10W 90/00 |
| 2010/0261332 A1 * | 10/2010 | Kim ........................ | H10P 70/15 |
| | | | 438/455 |
| 2017/0114250 A1 * | 4/2017 | Hähnel ...................... | C09J 5/08 |
| 2019/0381744 A1 | 12/2019 | Terai et al. | |
| 2020/0212004 A1 * | 7/2020 | Liu ........................ | H10W 90/00 |
| 2022/0173059 A1 * | 6/2022 | Chen ...................... | H10W 20/42 |
| 2022/0340416 A1 * | 10/2022 | Lee .......................... | B81C 3/001 |
| 2023/0067346 A1 * | 3/2023 | Chen ........................ | H10P 72/78 |
| 2024/0006301 A1 * | 1/2024 | Tong .................... | H10W 70/69 |

OTHER PUBLICATIONS

James J-Q. Lu et al., "Overview of Bonding and Assembly for 3D Integration", Handbook of 3D Integration, vol. 3: 3D Process Technology, Eds. P. Garrou, M. Koyanagi, and P. Ramm, pp. 261-278, 2014. (Total 16 pages).

* cited by examiner

FIG. 10

SUBSTRATE BONDING METHOD

CROSS-REFERENCE TO RELATED APPLICATION

This application is based on and claims priority under 35 U.S.C. § 119 to Korean Patent Application No. 10-2022-0141757, filed on Oct. 28, 2022, in the Korean Intellectual Property Office, the disclosure of which is incorporated by reference herein in its entirety.

BACKGROUND

The present disclosure relates to a substrate bonding method, and more particularly, to a substrate bonding method using atmospheric plasma.

In recent years, electronic devices have become more compact and lightweight according to the rapid development of electronic industries and users' demands. Semiconductor chips used in these electronic devices are required to exhibit high performance and large capacity along with reductions in size and weight. In order to manufacture semiconductor chips to achieve the aforementioned advantages, research and development on a substrate bonding method utilizing substrate-to-substrate bonding has been conducted.

SUMMARY

One or more example embodiments provide a process of forming a substrate-to-substrate bonding structure. In addition, one or more example embodiments provide a substrate bonding method that may exhibit excellent bonding strength and bonding reliability between bonding pads by performing hybrid bonding or direct bonding using atmospheric plasma.

One or more example embodiments are not limited to the advantages mentioned above, and one or more example embodiments may achieve other advantages not explicitly described herein will be clearly understood by those skilled in the art from the following description.

According to an aspect of an example embodiment, a substrate bonding method includes: forming first plasma on a bonding surface of a first substrate at atmospheric pressure by using a mixed gas including an inert gas and water vapor, to thereby perform surface activation treatment on the bonding surface of the first substrate; forming second plasma on a bonding surface of a second substrate at atmospheric pressure by using the mixed gas, to thereby perform surface activation treatment on the bonding surface of the second substrate; bonding the bonding surface of the first substrate and the bonding surface of the second substrate to each other; and moving each of the first substrate and the second substrate at a constant speed in a region above a linear reactor in which the first plasma and the second plasma are formed.

According to an aspect of an example embodiment, a substrate bonding method includes: forming first plasma on a bonding surface of a first substrate at atmospheric pressure by using a mixed gas including an inert gas and water vapor, to thereby perform surface activation treatment and hydrophilization treatment on the bonding surface of the first substrate; forming second plasma on a bonding surface of a second substrate at atmospheric pressure by using the mixed gas, to thereby perform surface activation treatment and hydrophilization treatment on the bonding surface of the second substrate; bonding the bonding surface of the first substrate and the bonding surface of the second substrate to each other, wherein the first substrate includes: a peripheral circuit; and a first bonding pad electrically connected to the peripheral circuit, wherein the second substrate includes: a plurality of gate electrodes spaced apart from each other and stacked in a vertical direction; a plurality of channel structures passing through the plurality of gate electrodes; and a second bonding pad electrically connected to at least one of the plurality of channel structures; and wherein the bonding includes bonding the first bonding pad of the bonding surface of the first substrate and the second bonding pad of the bonding surface of the second substrate to each other.

According to an aspect of an example embodiment, a substrate bonding method includes: forming first plasma on a bonding surface of a first substrate at atmospheric pressure by using a mixed gas including an inert gas and water vapor, to thereby perform surface activation treatment and hydrophilization treatment on the bonding surface of the first substrate; forming second plasma on a bonding surface of a second substrate at atmospheric pressure by using the mixed gas, to thereby perform surface activation treatment and hydrophilization treatment on the bonding surface of the second substrate; bonding the bonding surface of the first substrate and the bonding surface of the second substrate to each other, wherein the first substrate includes: a first conductive layer formed on the bonding surface of the first substrate; and a first bonding pad electrically connected to the first conductive layer, wherein the second substrate includes: a second conductive layer formed on the bonding surface of the second substrate; a second bonding pad electrically connected to the second conductive layer; and a plurality of photodiodes provided in the second substrate, and wherein the bonding includes the first bonding pad of the bonding surface of the first substrate and the second bonding pad of the bonding surface of the second substrate to each other.

BRIEF DESCRIPTION OF THE DRAWINGS

The above and other aspects and features will be more apparent from the following detailed description of example embodiments taken in conjunction with the accompanying drawings, in which:

FIGS. 10 and 11 are views showing a semiconductor element manufactured by a substrate bonding method according to one or more example embodiments.

DETAILED DESCRIPTION

Figure 1:
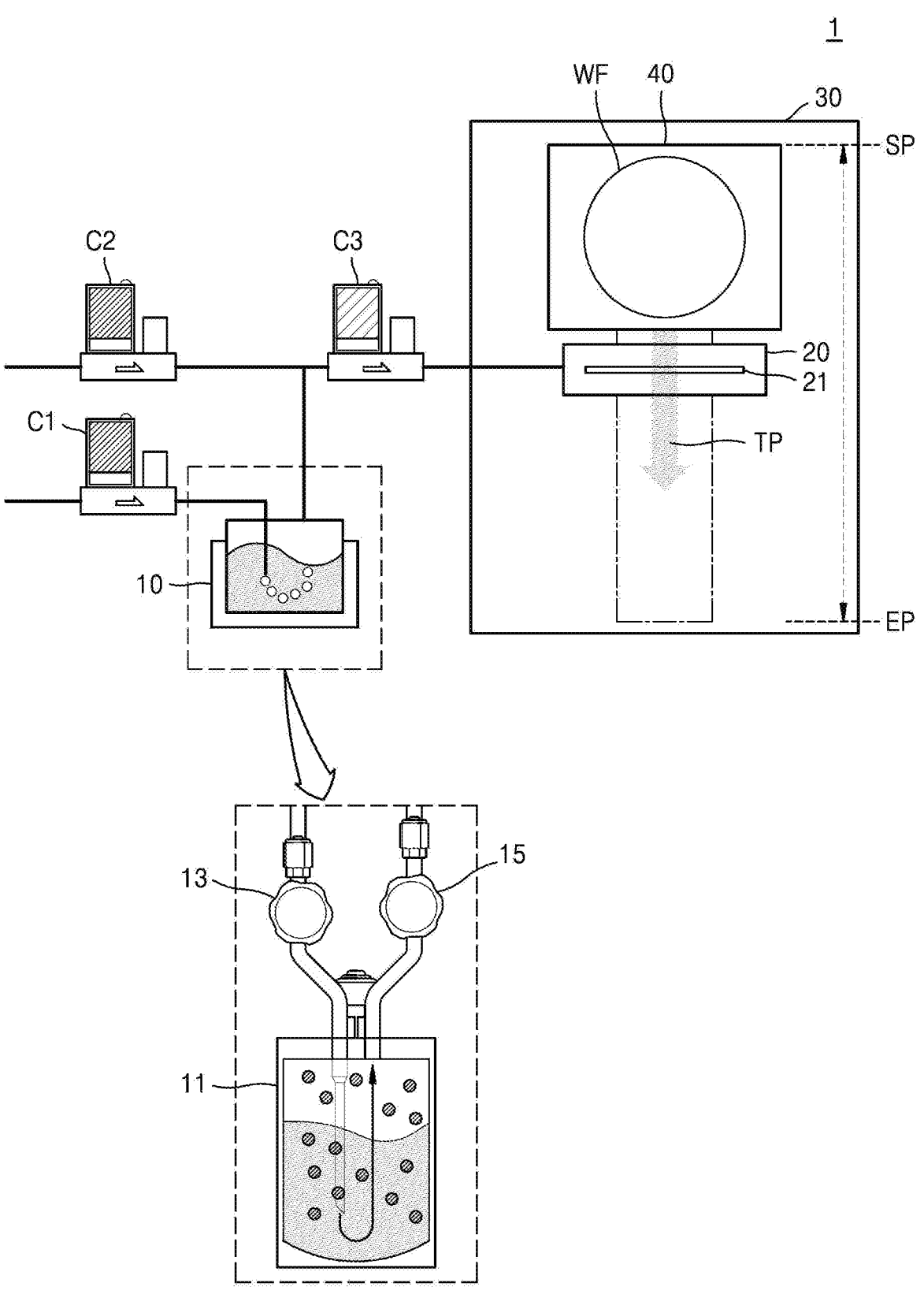
FIG. 1 is a conceptual view showing main components of a substrate bonding apparatus according to one or more example embodiments.

Hereinafter, example embodiments will be described in detail with reference to the accompanying drawings. The same reference numerals are used for the same components in the drawings, and duplicate descriptions thereof are omitted.

FIG. 1 is a conceptual view showing main components of a substrate bonding apparatus according to one or more example embodiments.

Referring to FIG. 1, a substrate bonding apparatus 1 may be a hydrophilic surface treatment apparatus using atmospheric plasma.

The substrate bonding apparatus 1 may include a gas providing unit 10 providing a mixed gas including an inert gas and water vapor and a reactor 20. The reactor 20 may receive the mixed gas from the gas providing unit 10 and may form plasma. According to one or more example embodiments, the reactor 20 may be located, on a conveyance path TP of a substrate WF, between a support unit 30 and a stage 40. Also, as used herein, the substrate WF may be understood as a concept including, but not limited to, a wafer, a chip, and a die.

The gas providing unit 10 may include a main body 11, a gas supply part 13 for introducing an inert gas into the main body 11; and a gas transport part 15 for transporting a carrier gas and water vapor to the reactor 20. In addition, ultrapure water may be stored in the main body 11 to generate water vapor, but one or more example embodiments are not limited thereto.

The reactor 20 may perform atmospheric plasma treatment to hydrophilize a bonding surface of the substrate WF which is being conveyed by the stage 40. The reactor 20 may have a rectangular shape with a long horizontal width, and may form a plasma sheath region on a bonding surface of the substrate WF while the substrate WF passes over the reactor 20 in a scanning manner. The plasma sheath region may overlap the conveyance path TP of the substrate WF.

The gas supply part 13 may regulate a supply amount of the carrier gas supplied to the gas providing unit 10 by using a first flow rate controller C1. The carrier gas may include argon (Ar), but one or more example embodiments are not limited thereto.

The gas transport part 15 may regulate a supply amount of the inert gas supplied to the reactor 20 by using a second flow rate controller C2. The inert gas may include argon (Ar), but one or more example embodiments are not limited thereto.

The pressure of the mixed gas supplied to the reactor 20 may be regulated by a third flow rate controller C3. The inert gas and the water vapor may be present in a mixed state in the mixed gas, and the water vapor may be generated from ultrapure water of the gas providing unit 10. However, one or more example embodiments are not limited thereto. For example, the water vapor may be supplied by a vaporizer or a bubbler. The surface activation treatment may be performed on the substrate WF by using atmospheric plasma formed according to the flow rate of the mixed gas.

An upper portion of the reactor 20 includes an opening 21 for linearly providing a plasma gas excited by a radio frequency (RF) power supply. The opening 21 may have a length equal to or greater than the width of the substrate WF so that the hydrophilization treatment is performed on the entire width of the bonding surface of the substrate WF. An operating state of the reactor 20 may be controlled by a sensor unit and a control unit.

The sensor unit may sense whether the substrate WF is located within a plasma treatment zone of the reactor 20. The control unit may stop the operation of the reactor 20 when the substrate WF is positioned in a region before entering the plasma treatment zone and in a region after passing through the plasma treatment zone. When the substrate WF is positioned within the plasma treatment zone, the reactor 20 may be operated to form plasma.

When the stage 40, on which the substrate WF is placed, enters a plasma start position SP of the plasma treatment zone, the operation of the reactor 20 may be started by the control unit, and the plasma sheath region may be formed on the conveyance path TP of the substrate WF. When the stage 40 moves in a straight line along the conveyance path TP and passes a plasma end position EP, the operation of the reactor 20 may be stopped. However, in one or more example embodiments, the stage 40 may reciprocate along the conveyance path TP. In this case, according to one or more example embodiments, the operation of the reactor 20 may not be stopped.

The conveyance height of the substrate WF and the position of the reactor 20 may be determined so that the bonding surface of the substrate WF may pass through the plasma sheath region. Here, the vertical distance between the substrate WF and the reactor 20 may be less than the thickness of the plasma sheath region exposed above the reactor 20. The plasma sheath region may be formed to a thickness of several millimeters (mm), and according to one or more example embodiments, the vertical distance between the substrate WF and the reactor 20 may be designed to be smaller than the thickness of the plasma sheath region.

No arc discharge by the plasma is formed at the plasma start position SP and the plasma end position EP. That is, the bonding surface of the substrate WF may be entirely hydrophilized only within the plasma treatment zone. When the plasma treatment zone is set too wide, the operating time of the reactor 20 is longer than necessary, resulting in an increase in process cost. On the other hand, when the plasma treatment zone is set too narrow, a portion the front and rear edges of the bonding surface of the substrate WF may not be hydrophilized, or a hydrophilization state may become non-uniform.

In one or more example embodiments, the plasma start position SP and the plasma end position EP may be respectively set to a position where the front end of the substrate WF starts to enter the plasma sheath region and a position where the rear end of the substrate WF starts to depart from the plasma sheath region. The conveyance speed of the substrate WF in the plasma treatment zone may be set equal to or less than the conveyance speed of the stage 40 before and after the plasma treatment zone.

When the bonding surface of the substrate WF is sufficiently hydrophilized, even without reducing the conveyance speed of the stage 40 in the plasma treatment zone, the substrate WF may be conveyed at a constant speed without changing a speed in the plasma treatment zone in order to improve productivity. According to one or more example embodiments, when a sufficient hydrophilic effect on the bonding surface of the substrate WF cannot be obtained because the conveyance speed of the stage 40 is not reduced in the plasma treatment zone, the stage 40 may be reciprocated a plurality of times to pass through the plasma treatment zone several times.

The surface treatment may be performed on each of a first substrate WF1 (see FIG. 2) and a second substrate WF2 (see FIG. 2) by using the substrate bonding apparatus 1 described above. That is, a specific substrate bonding method according to one or more example embodiments using the substrate bonding apparatus 1 may comprise the following.

Figure 2:
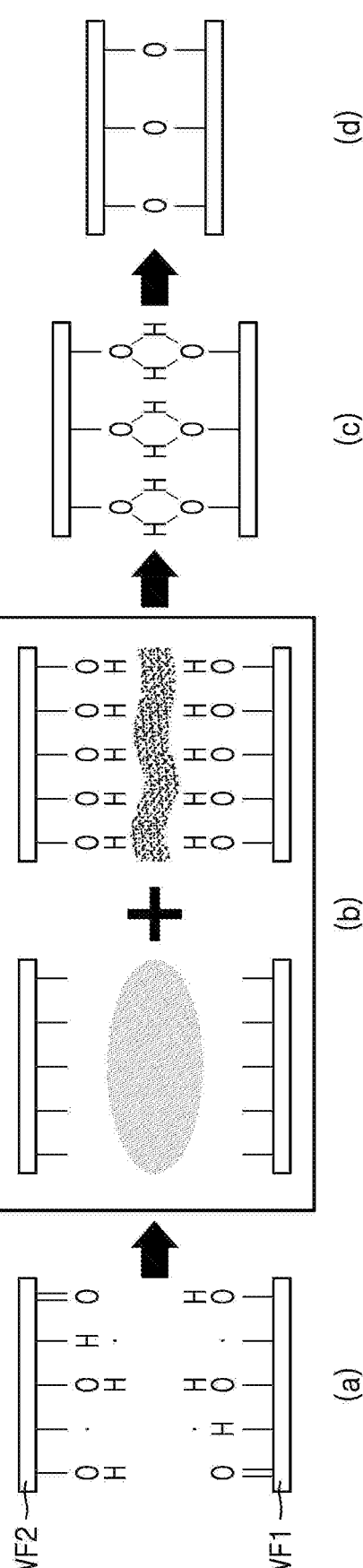
FIG. 2 is a conceptual view showing a substrate bonding process according to one or more example embodiments.

First, plasma may be formed on a bonding surface of the first substrate WF1 (see FIG. 2) at atmospheric pressure using a mixed gas comprising an inert gas and water vapor, and the surface activation treatment may be performed on the bonding surface of the first substrate WF1 (see FIG. 2).

In a similar method, plasma may be formed on a bonding surface of the second substrate WF2 (see FIG. 2) at atmospheric pressure using the mixed gas, and the surface activation treatment may be performed on the bonding surface of the second substrate WF2 (see FIG. 2).

As described above, according to one or more example embodiments, the hydrophilization treatment using the plasma may be performed on each of the bonding surface of the first substrate WF1 (see FIG. 2) and the bonding surface of the second substrate WF2 (see FIG. 2), and thus, the bonding surface of the first substrate WF1 (see FIG. 2) and the bonding surface of the second substrate WF2 (see FIG. 2) may be bonded to each other.

According to one or more example embodiments, each of the first substrate WF1 (see FIG. 2) and the second substrate WF2 (see FIG. 2) may move at a constant speed in a region above the reactor 20 in which the plasma is formed. The first substrate WF1 (see FIG. 2) and the second substrate WF2 (see FIG. 2) may be placed on the stage 40, which may be linearly reciprocating, and the moving speed of the stage 40 may be about 5 mm/s to about 60 mm/s. However, one or more example embodiments are not limited thereto. As described above, productivity may be reduced when the moving speed of the stage 40 is less than about 5 mm/s. However, when the moving speed of the stage 40 exceeds about 60 mm/s, the hydrophilic effect may be reduced. In addition, as the first substrate WF1 (see FIG. 2) and the second substrate WF2 (see FIG. 2) repeatedly move above the reactor 20, a plurality of times as described above, the hydrophilization treatment on the bonding surfaces may be completely performed.

Due to the hydrophilization treatment, hydroxyl groups (—OH) may be distributed on the bonding surface of the first substrate WF1 (see FIG. 2) and the bonding surface of the second substrate WF2 (see FIG. 2).

The specific process conditions for the atmospheric plasma may be as follows.

sccm to about 950 sccm. More specifically, according to one or more example embodiments, the flow rate of the mixed gas may be regulated from about 100 sccm to about 300 sccm.

In addition, the source power (or radio frequency (RF) power) for forming the plasma at atmospheric pressure may be regulated to about 300 W to about 900 W. More specifically, according to one or more example embodiments, the source power may be regulated to about 400 W.

According to one or more example embodiments, the RF frequency may be regulated from about 13.56 M to about 100 M. An experiment under the above conditions resulted in the bonding strength between the first substrate WF1 (see FIG. 2) and the second substrate WF2 (see FIG. 2) is about 2.00 J/m$^2$ or more.

Unlike the above, in the Comparative Example CX, in which the flow rate of the mixed gas is regulated to about 50 sccm as shown in Table 1 while other conditions are the same, the bonding strength between the first substrate WF1 (see FIG. 2) and the second substrate WF2 (see FIG. 2) may be about 1.98 J/m$^2$.

Figure 3:
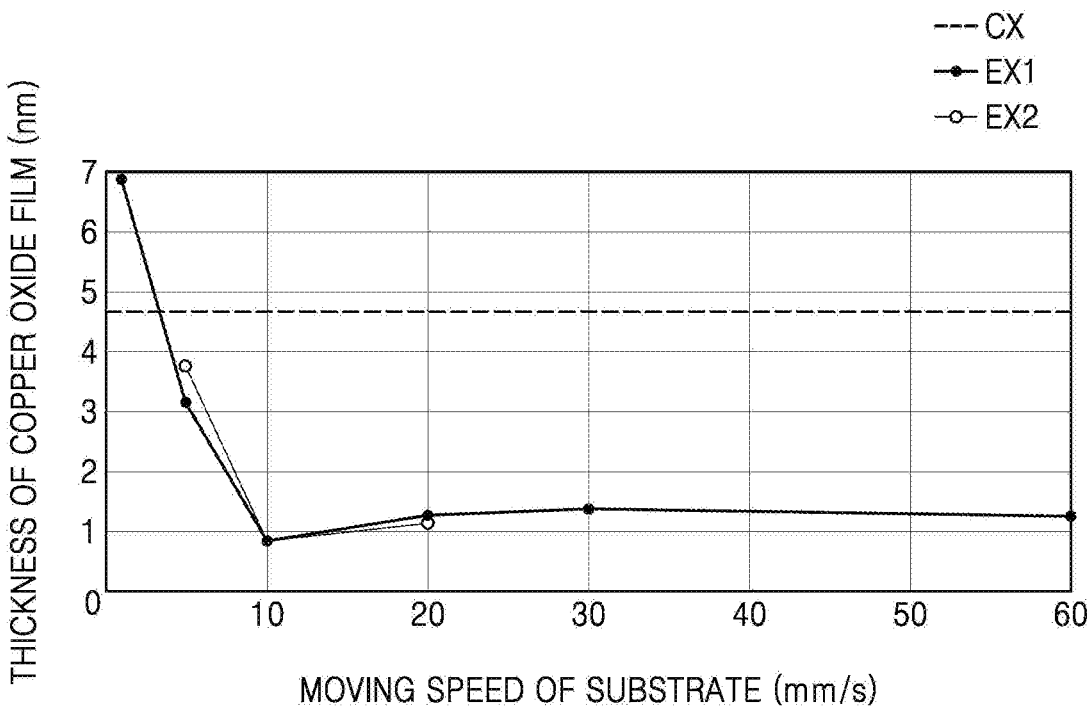
FIG. 3 is a graph showing a change in the thickness of a copper oxide film according to an amount of water vapor and a moving speed of a substrate according to one or more example embodiments.
Figure 4:
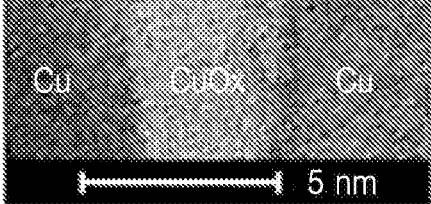
FIG. 4 is an electron microscope image showing the state of a copper oxide film in copper-to-copper bonding according to one or more example embodiments.

FIG. 2 is a conceptual view showing a substrate bonding process according to one or more example embodiments, FIG. 3 is a graph showing a change in the thickness of a copper oxide film according to an amount of water vapor and a moving speed of a substrate according to one or more example embodiments, and FIG. 4 is an electron microscope image showing the state of a copper oxide film in copper-to-copper bonding according to one or more example embodiments.

Referring to FIGS. 2, 3 and 4, plasma surface treatment (see (a) of FIG. 2) may be performed on each of the first and second substrates in a substrate-to-substrate bonding process in order to bond these substrates without using an adhesive. Here, according to one or more example embodiments, the first and second substrates may be generally manufactured by using various materials such as insulating materials including, but not limited to, silicon oxide, silicon nitride, and silicon carbonitride, and by using conductive materials such as copper (Cu).

The dangling bonds may be formed on the surface of the substrate by the plasma surface treatment, and the surface of the substrate has high surface energy. The hydroxyl groups (—OH) may be attached to the dangling bonds formed on the surface of the substrate by the hydrophilization treatment (see (b) of FIG. 2). The initial bonds between the first and second substrates (see (c) of FIG. 2) are formed by hydrogen bonds of the hydroxyl groups (—OH). Subsequently, the

TABLE 1

|  | Source Power [W] | Ar [Lpm] | Ar$^+$ Water Vapor [sccm] | Pressure [Torr] | Time [sec] | Annealing [° C./hour] | Bonding Strength [J/m$^2$] |
|---|---|---|---|---|---|---|---|
| Comparative Example (CX) | 400 | 20 | 50 | 760 | 30 | 350/1 | 1.98 |
| Experimental Example 1 (EX1) | 400 | 20 | 100 | 760 | 30 | 350/1 | 2.00 |
| Experimental Example 2 (EX2) | 400 | 20 | 300 | 760 | 30 | 350/1 | 2.10 |

As described in Table 1, the flow rate of the mixed gas may be regulated to about 100 standard cubic centimeters per minute ("sccm") or more in Experimental Example 1 (EX1) and Experimental Example 2 (EX2). Specifically, the flow rate of the mixed gas may be regulated from about 100 first and second substrates are bonded to each other with strong bonding strength (see (d) of FIG. 2) by a high-temperature annealing process.

When examining a bonding state of the substrates after the annealing process has been completed through the plasma surface treatment, a copper oxide film ($CuO_x$) may be formed between copper (Cu) and copper (Cu) as shown in FIG. 4. When the thickness of the copper oxide film ($CuO_x$) increases, problems may occur in electrical characteristics during subsequent processes. When the thickness of the copper oxide film ($CuO_x$) increases, the copper oxide film acts as a resistor that reduces conductivity between copper (Cu) and copper (Cu). Therefore, the copper oxide film may cause deterioration of electrical characteristics, may increase power consumption of a semiconductor chip, may promote heat generation, and may slow down signal transmission of the semiconductor chip, resulting in a reduction of the performance of the semiconductor chip.

Accordingly, process conditions for suppressing the formation of the copper oxide film ($CuO_x$) between copper (Cu) and copper (Cu) may be advantageous. According to one or more example embodiments, a process of reducing the thickness of the copper oxide film ($CuO_x$) from about 47 Å to about 10 Å or less while maintaining the bonding strength at about 2 $J/m^2$ may be employed.

In order to prevent performance reduction of the semiconductor chip due to the thickness of the copper oxide film ($CuO_x$), the use of hydrogen ($H_2$) as a reducing gas may remove oxygen ($O_2$) during the plasma surface treatment. However, the use of hydrogen ($H_2$) is difficult to apply in practice due to a problem in facility safety standards.

According to one or more example embodiments to address the above issues, water vapor, which is a uniform vaporized material, may be supplied in a mixed state when a gas for forming plasma is supplied. Therefore, process conditions may be improved so that the mixed gas vaporized into the reactor is constantly supplied and maintained. The detailed descriptions thereof may be similar to those described above.

The solubility varies depending on the inert gas used as a carrier gas, but water ($H_2O$) may be decomposed into a hydroxyl group (—OH) and a hydrogen atom (H) on the basis of a degree of the saturation of argon (Ar) with water ($H_2O$). Here, according to one or more example embodiments, due to the interaction between plasma and water vapor, the hydroxyl group (—OH) may contribute to increasing bonding strength.

When a relatively large amount of water vapor is provided in the plasma surface treatment compared to when a relatively small amount of water vapor is provided, more hydroxyl groups (—OH) may be generated to contribute to bonding strength. However, although one or more example embodiments are not bound by a certain theory in relation to the thickness of the copper oxide film ($CuO_x$), the hydrogen atoms (H) generated during the decomposition of water ($H_2O$) may interfere with the bonding between copper (Cu) and the hydroxyl groups (—OH) on the surface of copper (Cu).

As a result of measuring the thickness of the copper oxide film ($CuO_x$) using the process conditions described above, according to one or more example embodiments, it is possible to obtain a significantly lower thickness than the thickness under general process conditions as shown in the graph of FIG. 3. Specifically, in the graph of FIG. 3, the X axis represents a moving speed (mm/s) of the substrate, and the Y axis represents a thickness (nm) of the copper oxide film ($CuO_x$).

Referring to Table 1 and FIG. 3, it can be seen that the copper oxide film ($CuO_x$) has an average thickness of about 47 Å (4.7 nm) in the Comparative Example (CX). Unlike the above, when the moving speed of the substrate is about 10 minis in Experimental Example 1 (EX1) and Experimental Example 2 (EX2), it can be seen that the copper oxide film ($CuO_x$) has a thickness of about 10 Å (1 nm) or less.

Ultimately, in the substrate bonding method according to one or more example embodiments, hybrid bonding is performed using atmospheric pressure plasma and water vapor in order to form a substrate-to-substrate bonding structure. Accordingly, the copper oxide film ($CuO_x$) may have the thickness of about 10 Å or less, and thus, the bonding strength and bonding reliability between bonding pads may be excellent.

The substrate bonding method according to one or more example embodiments has been described as an embodiment of hybrid bonding, but one or more example embodiments are not limited thereto. For example, the substrate bonding method according to one or more example embodiments may be applied to direct bonding, and may also be applied to similar bonding methods. One or more example embodiments may be also applied, in a similar manner, as described below.

Figure 5:
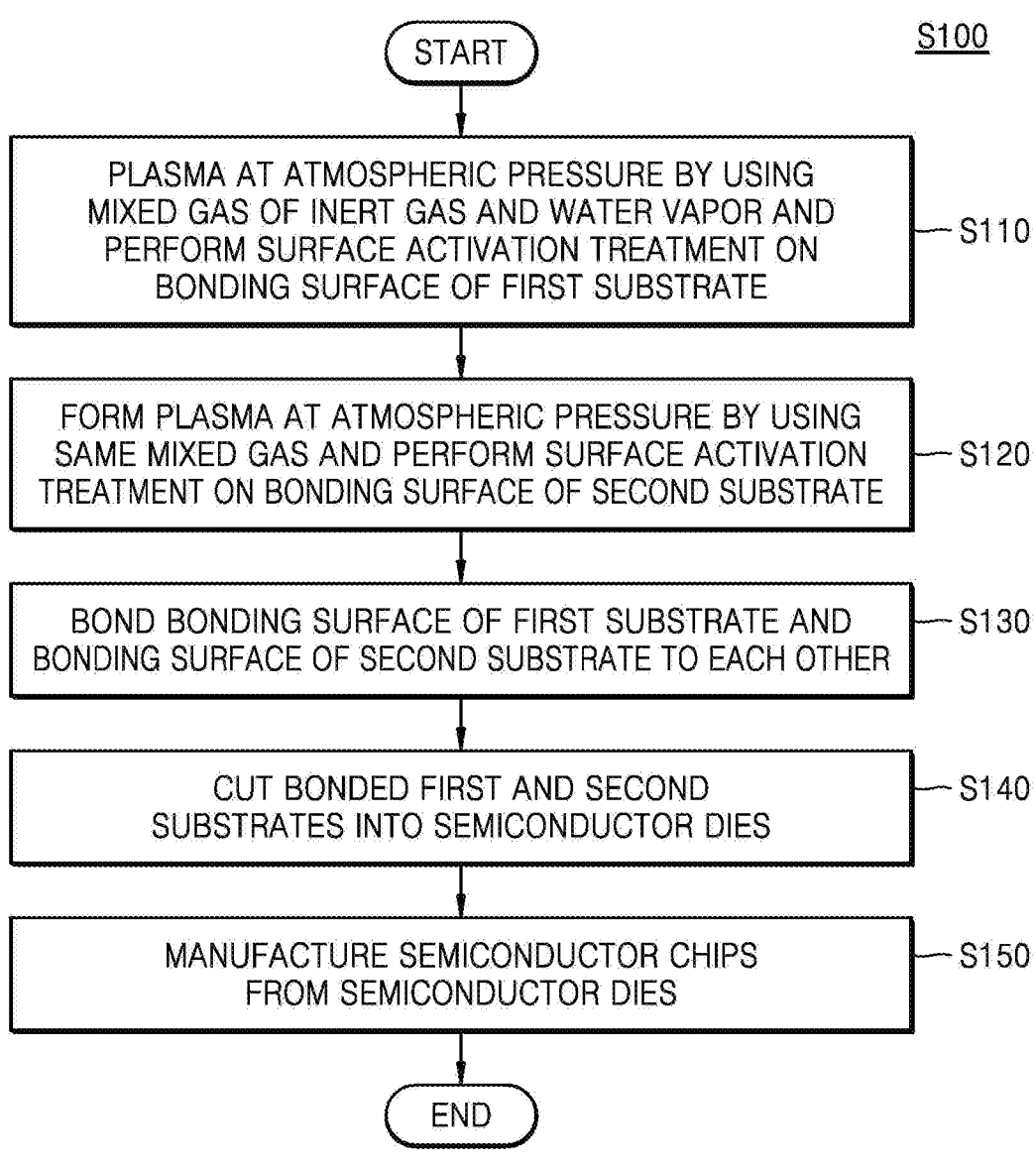
FIG. 5 is a flowchart showing a substrate bonding method according to one or more example embodiments.

FIG. 5 is a flowchart showing a substrate bonding method according to one or more example embodiments.

Referring to FIG. 5, a substrate bonding method (S100) according to one or more example embodiments may comprise operations S110, S120, S130, S140 and S150.

One or more example embodiments are not limited to the specific order shown in FIG. 5 and one or more example embodiments may implement operations shown in FIG. 5 in a different order. For example, two processes shown consecutively in FIG. 5, may be performed at substantially the same time, or may be performed in an order different from that according to one or more example embodiments shown in FIG. 5.

The substrate bonding method (S100) according to one or more example embodiments may include a first operation (S110) of forming plasma at atmospheric pressure by using a mixed gas of an inert gas and water vapor and performing surface activation treatment on a bonding surface of a first substrate. The substrate bonding method (S100) may further comprise a second operation (S120) of forming plasma at atmospheric pressure using the same mixed gas and performing surface activation treatment on a bonding surface of a second substrate. The substrate bonding method (S100) may further comprise a third operation (S130) of bonding the bonding surface of the first substrate and the bonding surface of the second substrate to each other. The substrate bonding method (S100) may further comprise a fourth operation (S140) of cutting the bonded first and second substrates into semiconductor dies, and a fifth operation (S150) of manufacturing semiconductor chips from the semiconductor dies.

Figure 6:
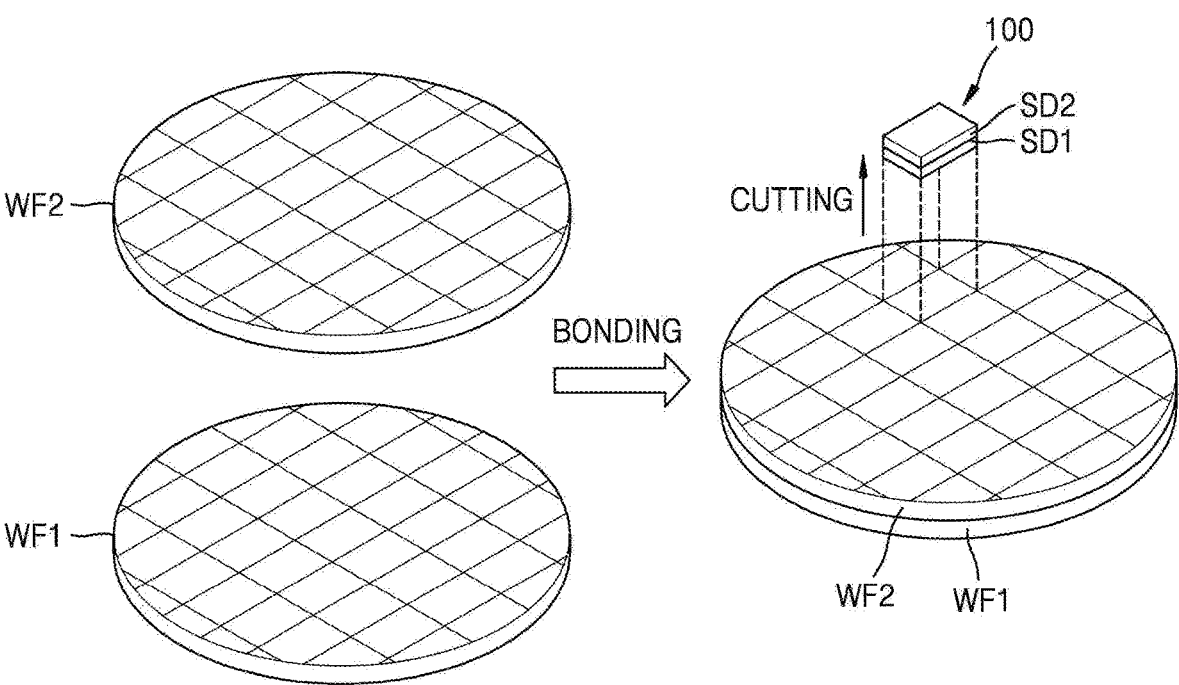
FIG. 6 is a perspective view showing a substrate bonding method according to one or more example embodiments.
Figure 7:
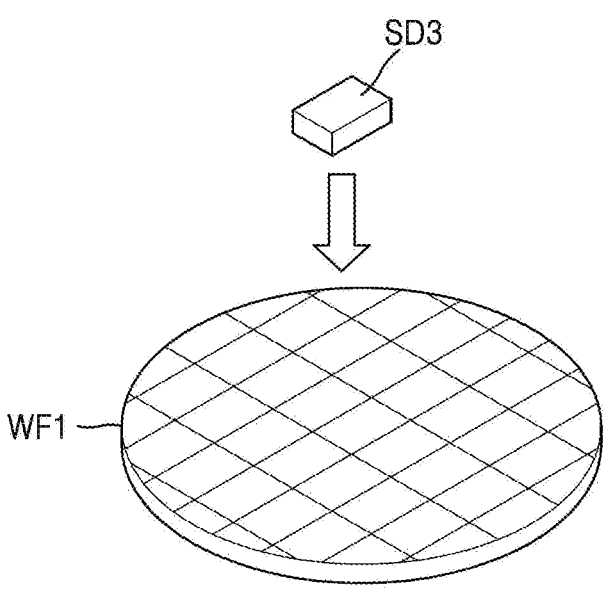
FIG. 7 is a perspective view showing a substrate bonding method according to one or more example embodiments.

FIG. 6 is a perspective view showing a substrate bonding method according to one or more example embodiments, and FIG. 7 is a perspective view showing a substrate bonding method according to one or more example embodiments.

Referring to FIG. 6, a first structure may be formed on a first substrate WF1, and a second structure may be formed on a second substrate WF2.

The first substrate WF1 and the second substrate WF2 may be bonded to each other, and the first substrate WF1 and the second substrate WF2 may be cut in a state in which the first substrate WF1 is bonded to the second substrate WF2. Accordingly, a plurality of chips 100 may be formed.

Each of the plurality of chips 100 may include a first semiconductor die SD1 and a second semiconductor die SD2 which are stacked over each other. The plurality of chips 100 may include at least one of a semiconductor element 200 or an image sensor 400 which are described below. The first semiconductor die SD1 may be obtained from the first substrate WF1. The second semiconductor die SD2 may be obtained from the second substrate WF2.

Referring to FIG. 7, according to one or more example embodiments, a first structure may be formed on a first substrate WF1, and a second structure may be formed on a second substrate.

Prior to bonding the second substrate to the first substrate WF1, a third semiconductor die SD3 may be formed by cutting the second substrate. Subsequently, the third semiconductor die SD3 may be pressed in a direction of an arrow and may be bonded to a partial region on the first substrate WF1.

As described above, one or more example embodiments may also be applied to a bonding process in a die-to-substrate method. That is, one or more example embodiments are not limited to the bonding process in the substrate-to-substrate method. As described above, according to one or more example embodiments, the substrate described herein may be understood as a concept including, but not limited to, a wafer, a chip, and a die.

Figure 8:
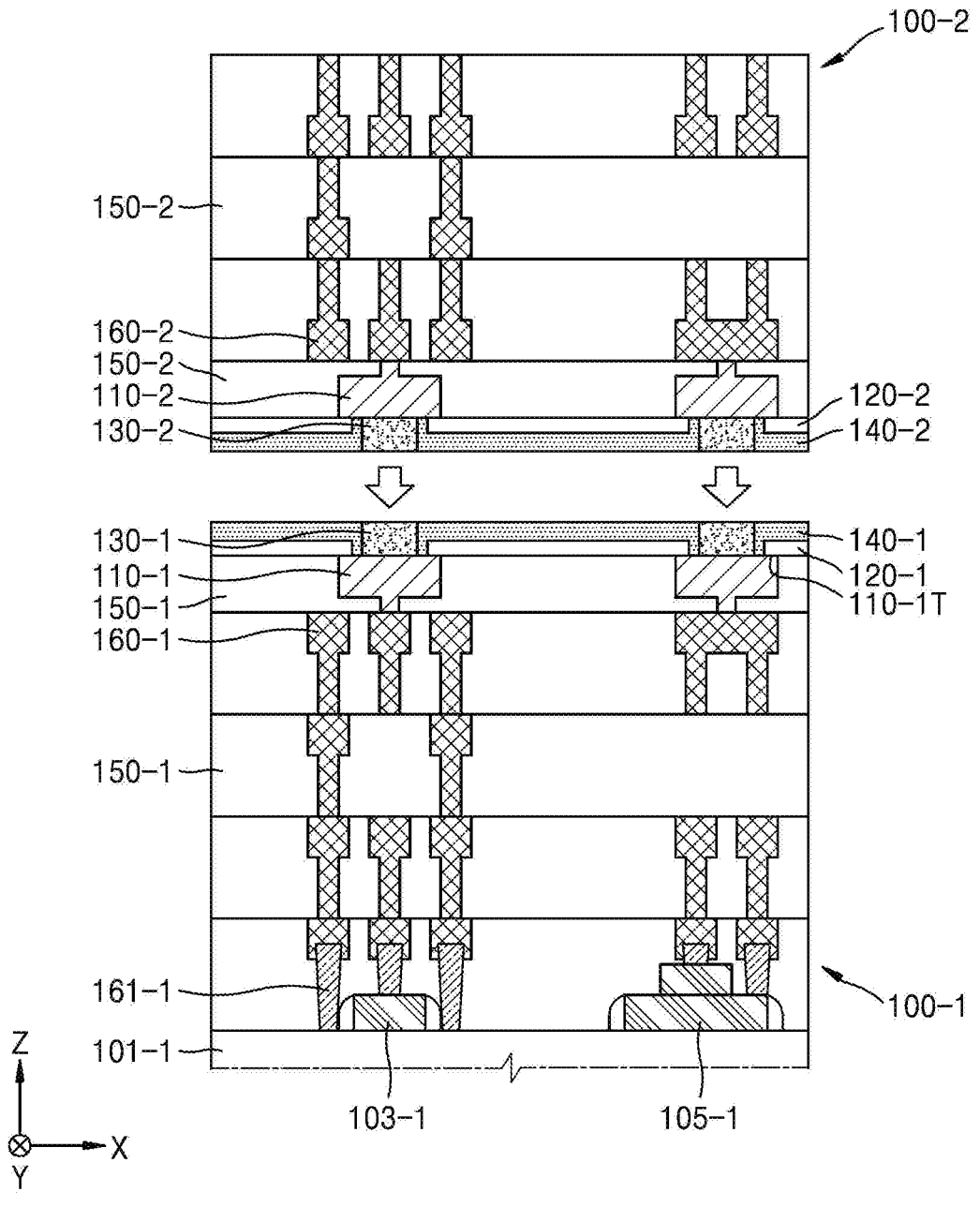
FIGS. 8 and 9 are cross-sectional views showing a method of manufacturing a substrate-to-substrate bonding structure according to one or more example embodiments.
Figure 9:
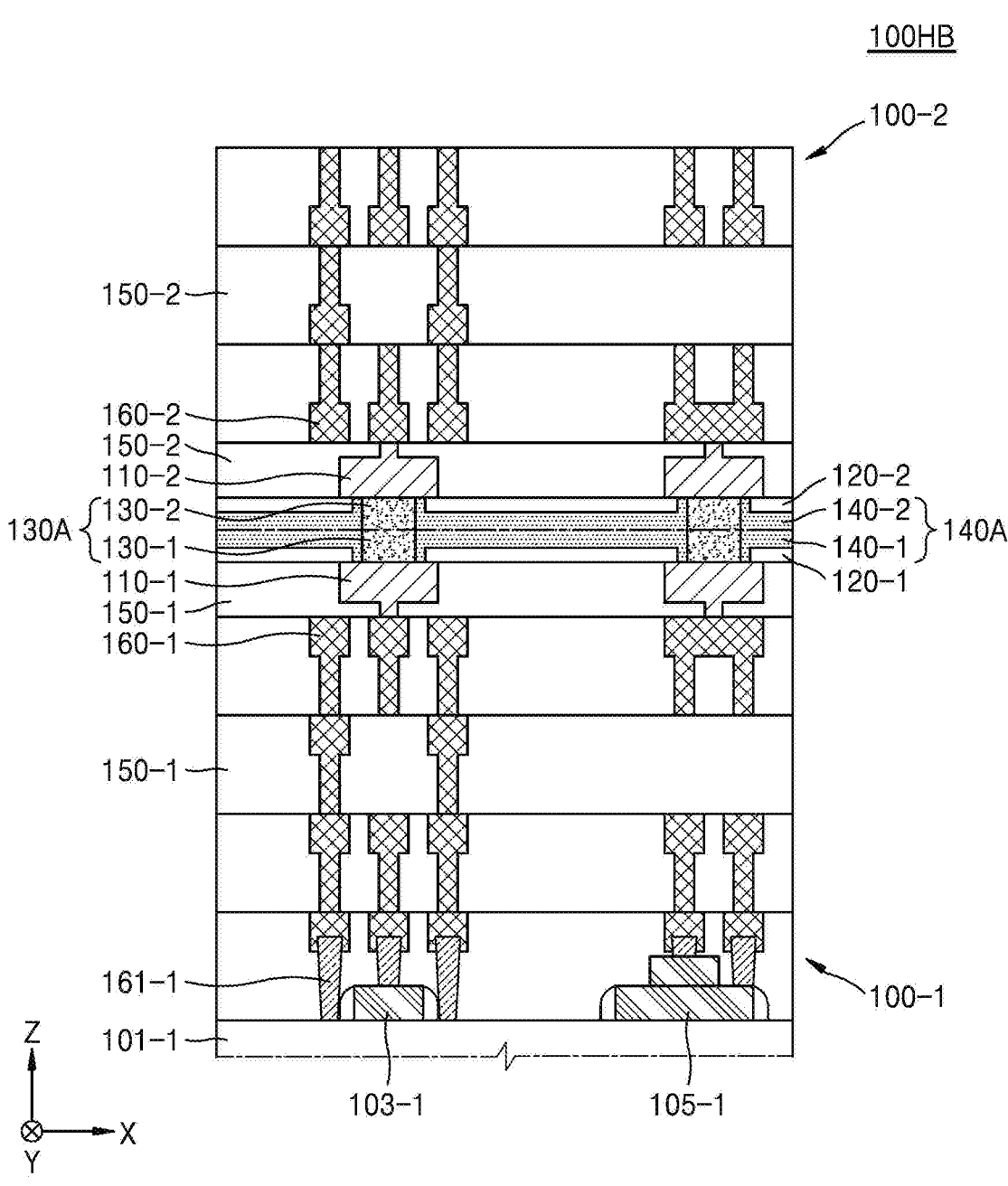

FIGS. 8 and 9 are cross-sectional views showing a method of manufacturing a substrate-to-substrate bonding structure, according to one or more example embodiments.

Referring to FIG. 8, a first substrate 100-1 may include first integrated circuit layers 103-1 and 105-1 formed above a first lower layer 101-1. The first substrate 100-1 may also include a first interlayer insulating film 150-1 and a first metal wiring layer 160-1. Further, the first substrate 100-1 may include a first lower pad 110-1 electrically connected to the first metal wiring layer 160-1, and may include a first insulating layer 120-1 formed above the first lower pad 110-1 and the first interlayer insulating film 150-1.

The first insulating layer 120-1 may cover a portion of an upper surface 110-1T of the first lower pad 110-1. That is, the first insulating layer 120-1 may cover edge portions of the first lower pad 110-1 without completely exposing the upper surface 110-1T of the first lower pad 110-1.

Next, a seed layer may be formed on the first lower pad 110-1, and then a first bonding pad 130-1 may be formed through a plating process using the seed layer.

The first bonding pad 130-1 may include, but is not limited to, for example, one metal selected from copper (Cu), nickel (Ni), gold (Au), and an alloy thereof, or may have a multilayer structure comprising a plurality of metals selected from copper (Cu), nickel (Ni), and gold (Au). According to one or more example embodiments, the first bonding pad 130-1 is described as including copper (Cu).

A first upper insulating layer 140-1 may fill a space between a sidewall of the first insulating layer 120-1 and a sidewall of the first bonding pad 130-1. An upper surface of the first bonding pad 130-1 and an upper surface of the first upper insulating layer 140-1 may be formed on the same plane.

A second substrate 100-2 having a structure similar to that of the first substrate 100-1 may also be prepared. The hydroxyl groups (—OH) may be attached to a bonding surface of the first substrate 100-1 and a bonding surface of the second substrate 100-2 by the surface activation treatment described above.

The second substrate 100-2 may be disposed on the first substrate 100-1 so that the first bonding pad 130-1 faces a second bonding pad 130-2, and the positions of the bonding pads are accurately aligned with one another. In other words, the upper surface of the first bonding pad 130-1 may be aligned to exactly match the upper surface of the second bonding pad 130-2.

Referring to FIG. 9, according to one or more example embodiments, a bonding pad 130A may be formed by bonding the first bonding pad 130-1 and the second bonding pad 130-2 to each other through annealing, and an upper insulating layer 140A may be formed by bonding the first upper insulating layer 140-1 and a second upper insulating layer 140-2 to each other. Accordingly, the first substrate 100-1 and the second substrate 100-2 may be bonded to each other.

As described above, the first substrate 100-1 and the second substrate 100-2 may be bonded to each other through the substrate bonding method (S100, see FIG. 5) according to one or more example embodiments. In other words, through the substrate bonding method (S100, see FIG. 5) according to one or more example embodiments, a hybrid bonding 100HB may be obtained in which the bonding pad 130A including a conductive material and the upper insulating layer 140A including an insulating material are simultaneously formed.

Figure 10:
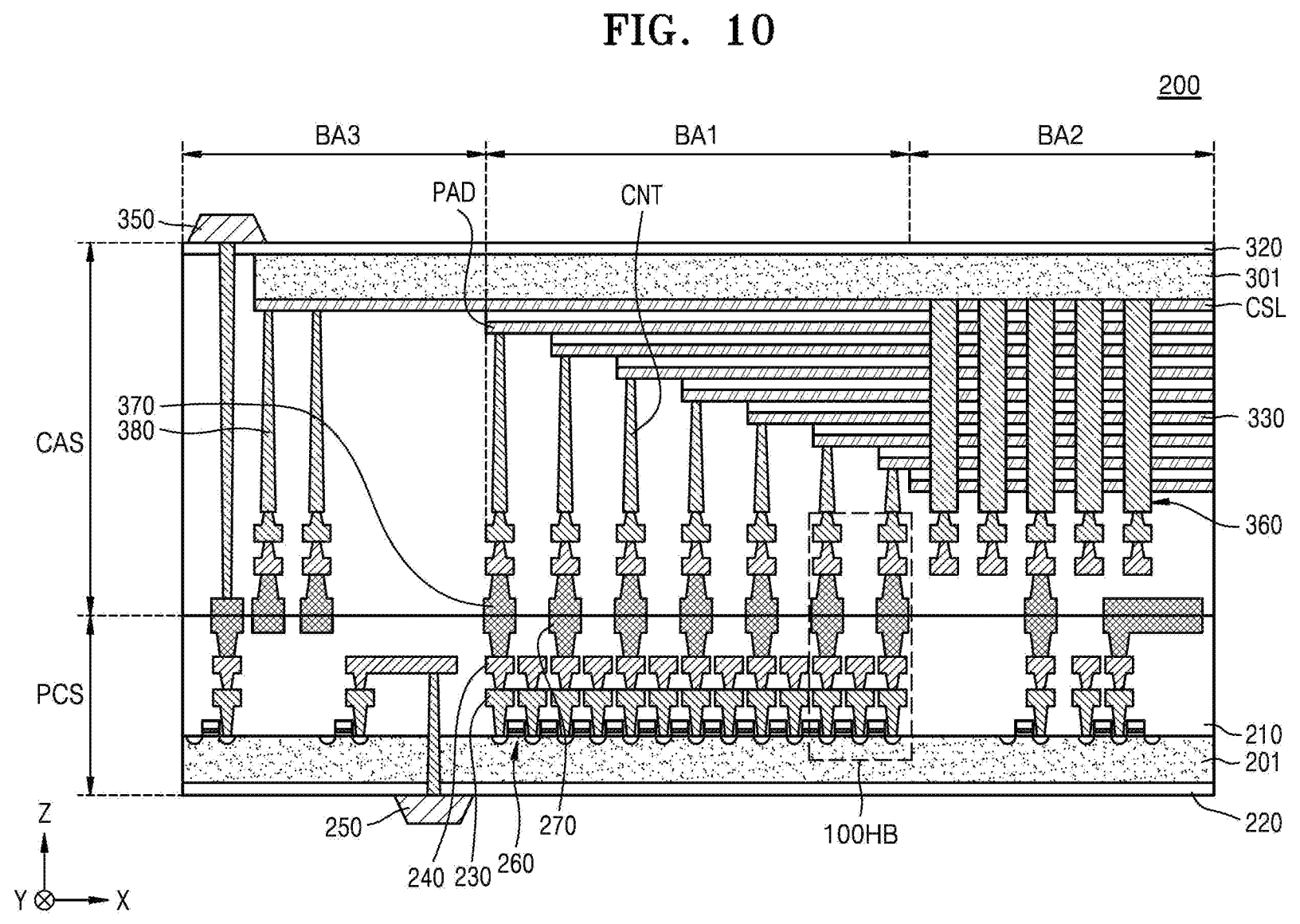
Figure 11:
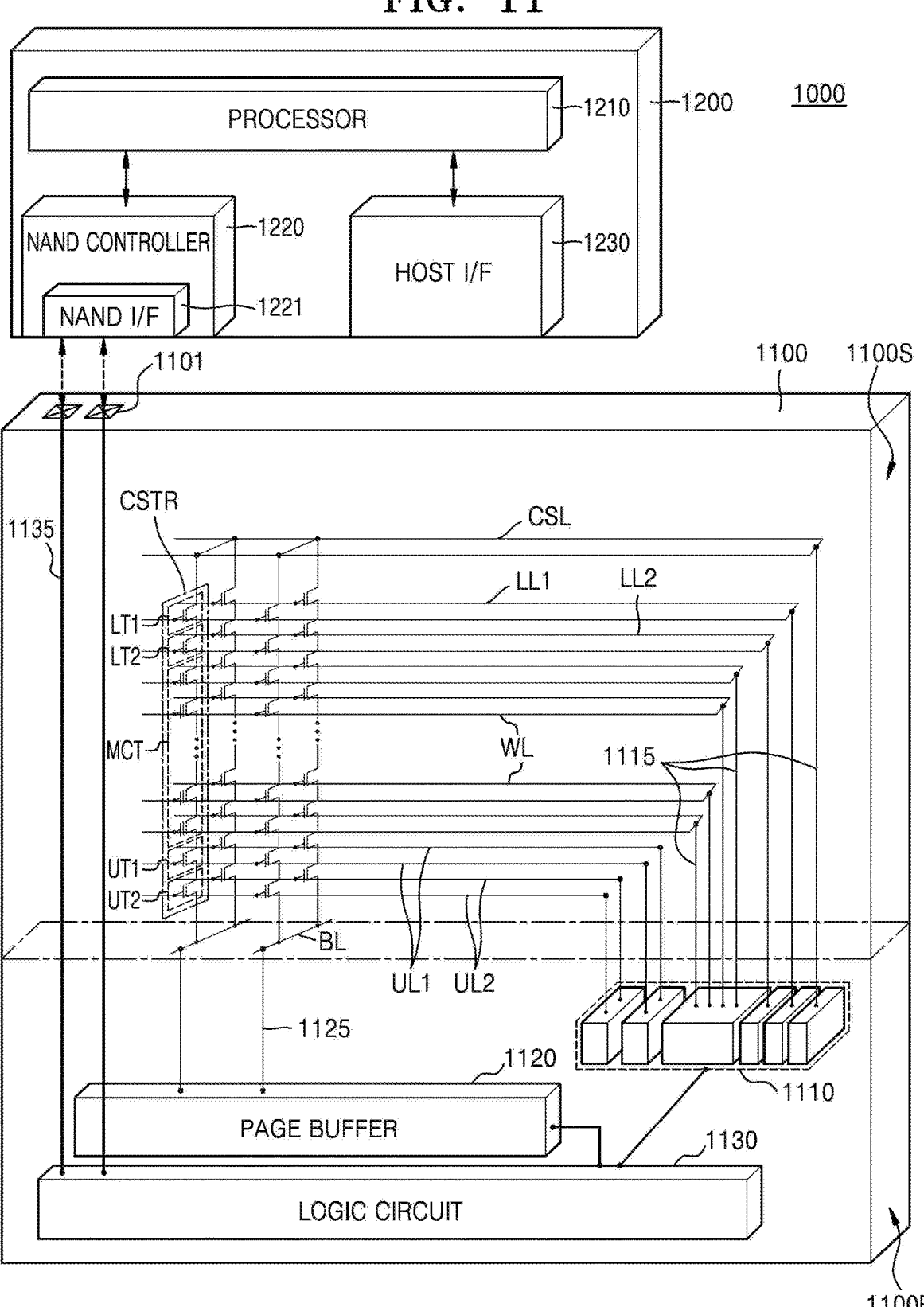

FIGS. 10 and 11 are views showing a semiconductor element manufactured by a substrate bonding method according to one or more example embodiments.

Referring to FIG. 10, according to one or more example embodiments, a semiconductor element 200 may include a chip-to-chip structure.

As shown in FIG. 10, according to one or more example embodiments, an upper substrate including a cell array structure CAS may be manufactured, and a lower substrate including a peripheral circuit structure PCS may be manufactured. The upper substrate and the lower substrate may be bonded to each other to form the chip-to-chip structure.

In one or more example embodiments, a bonding method may refer to a method of bringing a bonding pad formed on the lowermost portion of an upper chip and a bonding pad formed on the uppermost portion of a lower chip into contact with each other. The bonding method may include, but is not limited to, a metal-metal bonding structure, a through silicon via (TSV), a back via stack (BVS), a eutectic bonding structure, a ball grid array (BGA) bonding structure, a plurality of wiring lines, or a combination thereof.

According to one or more example embodiments, the bonding method may include providing the hybrid bonding 100HB. A method of forming the hybrid bonding 100HB may be similar to the example method(s) described above, and thus, a detailed description thereof is omitted.

The peripheral circuit structure PCS may include a circuit substrate 201, an interlayer insulating layer 210, a plurality of circuit elements 260, first metal layers 230 respectively connected to the plurality of circuit elements 260, and second metal layers 240 respectively formed on the first metal layers 230.

The interlayer insulating layer 210 may be disposed on the circuit substrate 201 to cover the plurality of circuit elements 260, the first metal layers 230, and the second metal layers 240. The interlayer insulating layer 210 may include an insulating material.

Lower bonding pads 270 may be respectively formed on the second metal layers 240 in a word line bonding region BA1. In the word line bonding region BA1, the lower bonding pads 270 of the peripheral circuit structure PCS may be electrically connected to upper bonding pads 370 of the cell array structure CAS by a bonding method.

The cell array structure CAS may provide at least one memory block. The cell array structure CAS may include a cell substrate 301 and a common source line CSL. Word lines 330 may be stacked on the cell substrate 301 in a third direction (Z direction).

In a bit line bonding region BA2, channel structures 360 may pass through the word lines 330, string selection lines, and a ground selection line in the third direction (Z direction).

In the word line bonding region BA1, the word lines 330 may extend parallel to the upper surface of the cell substrate 301 and may be connected to a plurality of contact plugs CNT. The word lines 330 and the plurality of contact plugs CNT may be connected to each other at pad portions PAD provided by the word lines 330 extending to different lengths.

Common source line contacts 380 may be located in an external pad bonding region BA3. Each of the common source line contacts 380 may include a conductive material including, but not limited to, a metal, a metal compound, or polysilicon, and may be electrically connected to the common source line CSL.

Also, first and second input/output pads 250 and 350 may be located in the external pad bonding region BA3. A lower film 220 covering a lower surface of the circuit substrate 201 may be formed below the circuit substrate 201, and the first input/output pad 250 may be formed on the lower film 220. An upper film 320 covering an upper surface of the cell substrate 301 may be formed on the cell substrate 301, and the second input/output pad 350 may be disposed on the upper film 320.

The semiconductor element 200 manufactured by the substrate bonding method according to one or more example embodiments may have excellent bonding strength and bonding reliability between the bonding pads by providing a hybrid bonding 100HB by using atmospheric plasma.

Referring to FIG. 11, an electronic system 1000 according to one or more example embodiments may include a semiconductor element 1100 and a controller 1200 electrically connected to the semiconductor element 1100.

The electronic system 1000 may include a storage device including the semiconductor element 1100 or an electronic apparatus including the storage device. For example, the electronic system 1000 may include, but is not limited to, a solid state drive (SSD) device, a universal serial bus (USB) device, a computing system, a medical device, or a communication device, which includes at least one semiconductor element 1100.

The semiconductor element 1100 may include a nonvolatile vertical memory element. The semiconductor element 1100 may include a first structure 1100F and a second structure 1100S provided on the first structure 1100F. In one or more example embodiments, the first structure 1100F may be located next to the second structure 1100S. The first structure 1100F may include a peripheral circuit structure which includes a decoder circuit 1110, a page buffer 1120, and a logic circuit 1130. The second structure 1100S may include a memory cell structure which includes a bit line BL, a common source line CSL, a plurality of word lines WL, first and second gate upper lines UL1 and UL2, first and second gate lower lines LL1 and LL2, and a plurality of memory cell strings CSTR between the bit line BL and the common source line CSL.

In the second structure 1100S, each of the plurality of memory cell strings CSTR may include lower transistors LT1 and LT2 adjacent to the common source line CSL, upper transistors UT1 and UT2 adjacent to the bit line BL, and a plurality of memory cell transistors MCT arranged between the lower transistors LT1 and LT2 and the upper transistors UT1 and UT2. The number of lower transistors LT1 and LT2 and the number of upper transistors UT1 and UT2 may be variously changed according to one or more example embodiments.

In one or more example embodiments, the upper transistors UT1 and UT2 may include string selection transistors, and the lower transistors LT1 and LT2 may include ground selection transistors. A plurality of gate lower lines LL1 and LL2 may include gate electrodes of the lower transistors LT1 and LT2, respectively. The word lines WL may include gate electrodes of the memory cell transistors MCT, and gate upper lines UL1 and UL2 may include gate electrodes of the upper transistors UT1 and UT2.

The common source line CSL, the plurality of gate lower lines LL1 and LL2, the plurality of word lines WL, and the plurality of gate upper lines UL1 and UL2 may be electrically connected to the decoder circuit 1110 inside the first structure 1100F via the plurality of first connection wires 1115 extending to the second structure 1100S. A plurality of bit lines BL may be electrically connected to the page buffer 1120 inside the first structure 1100F via a plurality of second connection wires 1125 extending to the second structure 1100S.

In the first structure 1100F, the decoder circuit 1110 and the page buffer 1120 may execute a control operation on at least one of the plurality of memory cell transistors MCT. The decoder circuit 1110 and the page buffer 1120 may be controlled by the logic circuit 1130.

The semiconductor element 1100 may communicate with the controller 1200 via an input/output pad 1101 electrically connected to the logic circuit 1130. The input/output pad 1101 may be electrically connected to the logic circuit 1130 inside the first structure 1100F via an input/output connection wire 1135 extending to the second structure 1100S.

The controller 1200 may include a processor 1210, a NAND controller 1220, and a host interface 1230. In one or more example embodiments, the electronic system 1000 may include a plurality of semiconductor elements 1100. According to one or more example embodiments, the controller 1200 may control the plurality of semiconductor elements 1100.

The processor 1210 may control the overall operation of the electronic system 1000 including the controller 1200. The processor 1210 may operate according to certain firmware and may access the semiconductor element 1100 by controlling the NAND controller 1220. The NAND controller 1220 may include a NAND interface 1221 that processes communication with the semiconductor element 1100. A control command for controlling the semiconductor element 1100, data to be written to the plurality of memory cell transistors MCT of the semiconductor element 1100, and data to be read from the plurality of memory cell transistors MCT of the semiconductor element 1100 may be transmitted via the NAND interface 1221. The host interface ("host I/F") 1230 may provide a communication function between the electronic system 1000 and an external host. When a control command is received from the external host via the host interface 1230, the processor 1210 may control the semiconductor element 1100 in response to the control command.

Figure 12:
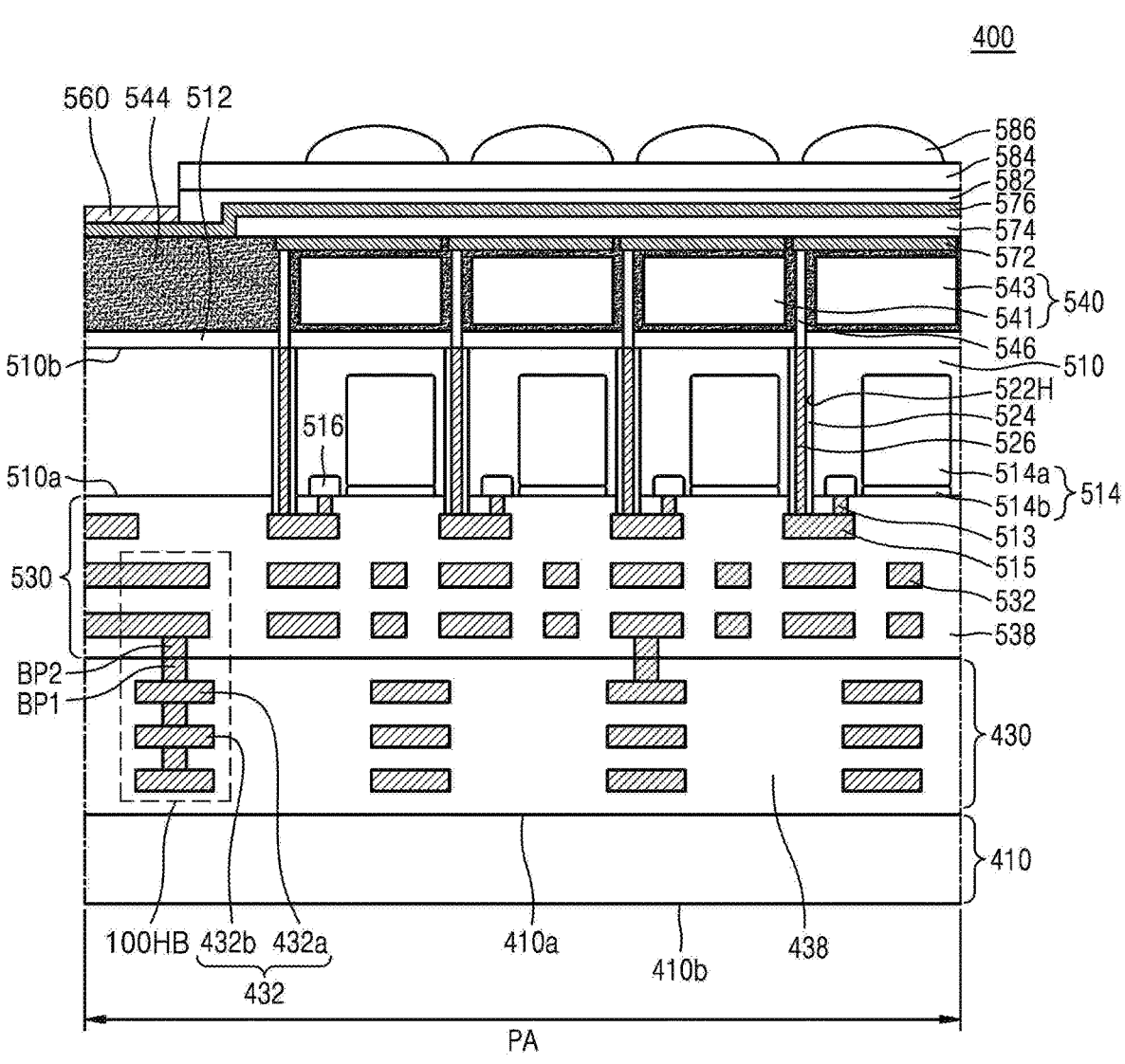
FIGS. 12 and 13 are views showing an image sensor manufactured by a substrate bonding method according to one or more example embodiments.
Figure 13:
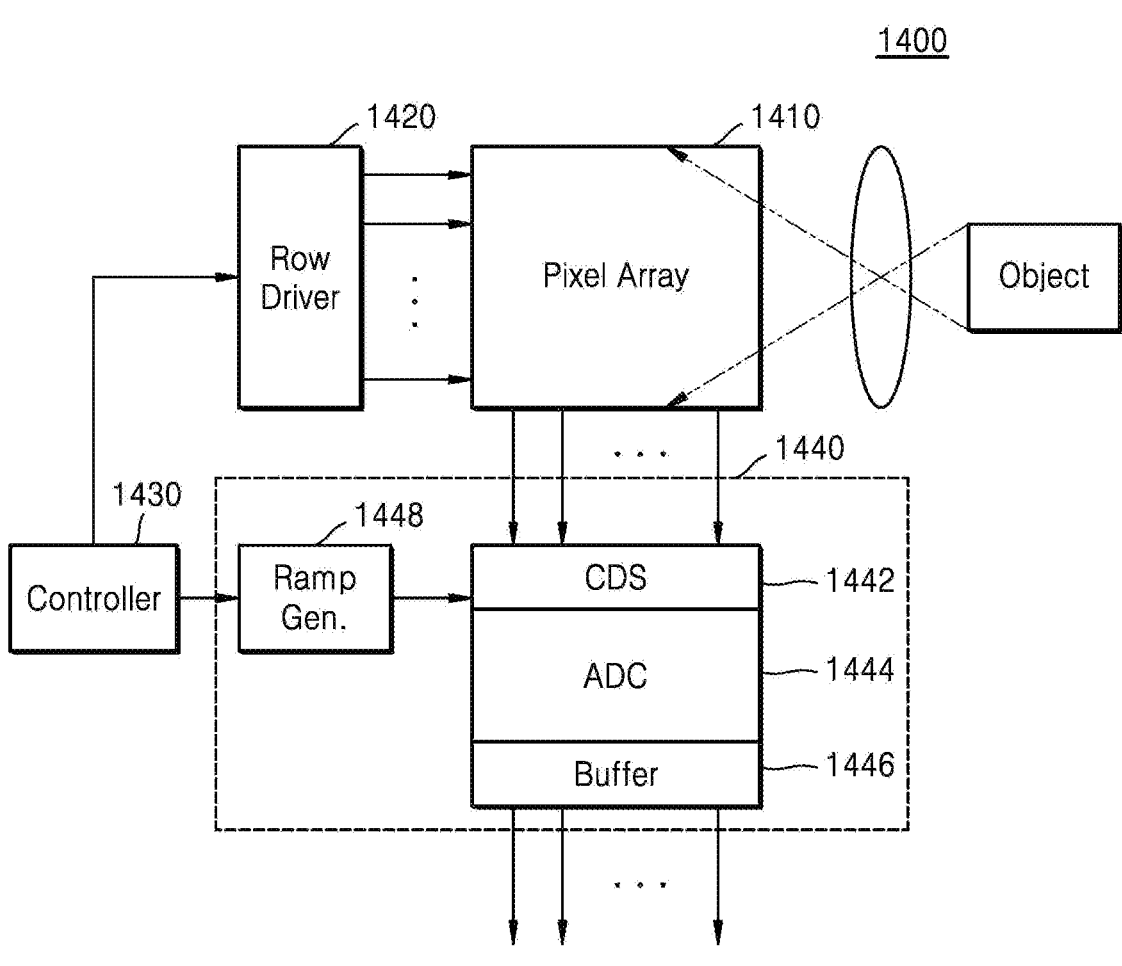

FIGS. 12 and 13 are views showing an image sensor manufactured by a substrate bonding method according to one or more example embodiments.

Referring to FIG. 12, an image sensor 400 may include a pixel region PA in which a plurality of unit pixels are arranged.

The image sensor 400 may include first and second substrates 410 and 510, a first structure 430 formed on a first surface 410a of the first substrate 410, and a second structure 530 formed on a first surface 510a of a second substrate 510. The first structure 430 and the second structure 530 may be bonded to each other as the first surface 410a of the first substrate 410 and the first surface 510a of the second substrate 510 are arranged to face each other. In one or more example embodiments, a bonding method may refer to a method of bringing a first bonding pad BP1 of the first substrate 410 and a second bonding pad BP2 of the second substrate 510 into contact with each other.

According to one or more example embodiments, the bonding method may include providing a hybrid bonding 100HB. A method of forming the hybrid bonding 100HB is similar to the example method(s) described above, and thus, a detailed description thereof is omitted.

The first structure 430 may be formed on the first surface 410a of the first substrate 410. The first structure 430 may include first wiring layers 432 formed at different levels in the pixel region PA, contact plugs connecting the first wiring layers 432 to each other, and a first interlayer insulating film 438 covering the first wiring layers 432 and the contact plugs.

In one or more example embodiments, the pixel region PA of the first substrate 410 may correspond to an element region. That is, a logic element for controlling the image sensor 400 may be located in the element region of the first substrate 410.

The second structure 530 may be formed on the first surface 510a of the second substrate 510. The second structure 530 may include second wiring layers 532 formed at different levels in the pixel region PA, contact plugs connecting the second wiring layers 532 to each other, and a second interlayer insulating film 538 covering the second wiring layers 532 and the contact plugs.

A plurality of photoelectric conversion elements 514 may be arranged in the pixel region PA of the second substrate 510. The photoelectric conversion elements 514 may be respectively arranged in the unit pixels of the pixel region PA. In one or more example embodiments, the photoelectric conversion elements 514 may include, but are not limited to, photodiodes.

Each of the photoelectric conversion elements 514 may include a first impurity region 514a and a second impurity region 514b. A storage node region 516 may be located adjacent to the photoelectric conversion element 514.

The second structure 530 may have a contact via 513 contacting the storage node region 516 and extending into the second structure 530 and a buffer layer 515 contacting the contact via 513. The buffer layer 515 may be electrically connected to the storage node region 516 via the contact via 513.

A via hole 522H extending from a second surface 510b to the buffer layer 515 through the second substrate 510 may be formed in the pixel region PA of the second substrate 510. A via insulating film 524 may be formed on a side wall of the via hole 522H. The via insulating film 524 may include, but is not limited to, silicon oxide or silicon nitride. The via hole 522H may be filled with a via plug 526. The via plug 526 may completely fill the via hole 522H to contact the via insulating film 524.

A portion of the second surface 510b of the second substrate 510 may be recessed, and an anti-reflection film 512 may be formed to cover the recessed portion evenly. The anti-reflection film 512 prevents light incident from the outside from being reflected from the second substrate 510, and thus, more light may be incident to the photoelectric conversion element 514.

A color filter layer 540 may be formed above the anti-reflection film 512 on the second surface 510b of the second substrate 510. The color filter layer 540 may allow light incident via a micro lens 586 to pass and may allow only light having a required wavelength to be incident to the photoelectric conversion element 514.

In one or more example embodiments, the color filter layer 540 may include a first color filter layer 541 and a second color filter layer 543. The first color filter layer 541 or the second color filter layer 543, which corresponds to the photoelectric conversion element 514, may be located in each of the unit pixels of the pixel region PA.

A cover insulating layer 544 covering the color filter layer 540 may be formed above the second surface 510b of the second substrate 510. In one or more example embodiments, the cover insulating layer 544 may have a multilayer structure. A portion of the cover insulating layer 544 may be located between the color filter layer 540 and the anti-reflection film 512, and another portion of the cover insulating layer 544 may be located on an upper surface of the color filter layer 540.

A second via plug 546 may be formed in the cover insulating layer 544. The second via plug 546 may be electrically connected to the via plug 526 after passing through the cover insulating layer 544. The second via plug 546 may be formed as a single body that extends from the upper surface to the lower surface of the cover insulating layer 544.

A lower transparent electrode layer 572 may be formed on the cover insulating layer 544. A plurality of lower transparent electrode layers 572 may be provided to respectively correspond to the plurality of photoelectric conversion elements 514.

An upper transparent electrode layer 576 may be formed on a photoelectric layer 574. The upper transparent electrode layer 576 may be integrally formed over the pixel region PA. That is, the upper transparent electrode layer 576 may be integrally formed over the plurality of photoelectric conversion elements 514.

A second cover insulating layer 582 may be formed above the cover insulating layer 544 and the upper transparent electrode layer 576. The second cover insulating layer 582 may include a transparent insulating material. The second cover insulating layer 582 may include, but is not limited to, for example, silicon oxide.

In one or more example embodiments, a third cover insulating layer 584 may be formed on the second cover insulating layer 582. The third cover insulating layer 584 may be formed to cover an upper surface of the second cover insulating layer 582.

The micro lens 586 corresponding to the color filter layer 540 may be formed on the third cover insulating layer 584 in the pixel region PA of the second substrate 510. In one or more example embodiments, when the third cover insulating layer 584 is omitted, the micro lens 586 may be formed on the second cover insulating layer 582. The micro lens 586 may overlap the corresponding color filter layer 540.

The image sensor 400 manufactured by the substrate bonding method according to one or more example embodiments may have excellent bonding strength and bonding reliability between the bonding pads by providing a hybrid bonding 100HB by using atmospheric plasma.

Referring to FIG. 13, according to one or more example embodiments, an image sensor 1400 may include a pixel array 1410, a controller 1430, a row driver 1420, and a pixel signal processing unit 1440.

The pixel array 1410 may include a plurality of unit pixels that are two-dimensionally arranged, and each of the unit pixels may include a photoelectric conversion element. The photoelectric conversion element may absorb light and may generate an electric charge, and an electrical signal (output voltage) according to the generated electric charge may be provided to the pixel signal processing unit 1440 via a vertical signal line. The unit pixels included in the pixel array 1410 may provide one output voltage at a time in units of rows. Accordingly, the unit pixels belonging to one row of the pixel array 1410 may be simultaneously activated by a selection signal output from the row driver 1420. The unit pixel belonging to the selected row may provide an output voltage according to the absorbed light to an output line of a corresponding column.

The controller 1430 may control the pixel array 1410 to absorb light to accumulate electric charge or to temporarily store the accumulated electric charge, and may control the row driver 1420 to output an electrical signal according to the stored electric charge to the outside of the pixel array 1410. Also, the controller 1430 may control the pixel signal processing unit 1440 to measure the output voltage provided from the pixel array 1410.

The pixel signal processing unit 1440 may include a correlated double sampler ("CDS") 1442, an analog-to-digital converter ("ADC") 1444, and a buffer 1446. The correlated double sampler 1442 may sample and hold the output voltage provided from the pixel array 1410. The correlated double sampler 1442 may double sample a level according to a specific noise level and the generated output voltage, and may output a level corresponding to the difference therebetween. In addition, the correlated double sampler 1442 may receive ramp signals generated by a ramp signal generator 1448 and may compare the received ramp signals with each other to output a comparison result.

The analog-to-digital converter 1444 may convert an analog signal corresponding to a level received from the correlated double sampler 1442 into a digital signal. The buffer 1446 may latch digital signals, and the latched signals may be sequentially output to the outside of the image sensor 1400 and transmitted to an image processor.

While one or more example embodiments have been particularly shown and described above, it will be apparent to those skilled in the art that various changes in form and details may be made therein without departing from the spirit and scope of the following claims.

What is claimed is:

1. A substrate bonding method comprising:
forming first plasma on a bonding surface of a first substrate at atmospheric pressure by using a mixed gas comprising an inert gas and water vapor, to thereby perform surface activation treatment on the bonding surface of the first substrate;
forming second plasma on a bonding surface of a second substrate at atmospheric pressure by using the mixed gas, to thereby perform surface activation treatment on the bonding surface of the second substrate;
bonding the bonding surface of the first substrate and the bonding surface of the second substrate to each other; and
moving each of the first substrate and the second substrate at a constant speed in a region above a linear reactor in which the first plasma and the second plasma are formed.

2. The substrate bonding method of claim 1, wherein the inert gas comprises argon (Ar), and
wherein a flow rate of the mixed gas is regulated to be from 100 sccm to 950 sccm.

3. The substrate bonding method of claim 1, wherein a radio frequency (RF) power for the forming the first plasma and the forming the second plasma at atmospheric pressure is regulated to be from 300 W to 900 W, and an RF frequency for the forming the first plasma and the forming the second plasma is regulated to be from 13.56 M to 100 M.

4. The substrate bonding method of claim 1, wherein hydroxyl groups (—OH) are distributed on each of the bonding surface of the first substrate and the bonding surface of the second substrate by the surface activation treatment.

5. The substrate bonding method of claim 1, further comprising linearly reciprocating a stage on which the first substrate and the second substrate are provided; and
moving the stage at a moving speed from 5 mm/s to 60 mm/s.

6. The substrate bonding method of claim 1, further comprising repeatedly moving the first substrate and the second substrate above the linear reactor.

7. The substrate bonding method of claim 1, wherein the water vapor is supplied from ultrapure water.

8. The substrate bonding method of claim 1, wherein the water vapor is supplied by a vaporizer.

9. The substrate bonding method of claim 1, wherein the water vapor is supplied by a bubbler.

10. The substrate bonding method of claim 1, wherein the bonding comprises bonding the bonding surface of the first substrate and the bonding surface of the second substrate to each other using hybrid bonding.

*   *   *   *   *